United States Patent
Roig-Guitart et al.

(10) Patent No.: US 8,299,528 B2
(45) Date of Patent: Oct. 30, 2012

(54) TRANSISTOR AND METHOD THEREOF

(75) Inventors: Jaume Roig-Guitart, Oudenaarde (BE); Peter Moens, Zottegem (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 233 days.

(21) Appl. No.: 12/651,118

(22) Filed: Dec. 31, 2009

(65) Prior Publication Data

US 2011/0156141 A1 Jun. 30, 2011

(51) Int. Cl.
*H01L 29/08* (2006.01)
*H01L 29/165* (2006.01)
*H01L 29/78* (2006.01)

(52) U.S. Cl. ........ 257/339; 257/341; 257/343; 257/365; 438/151; 438/294; 438/296

(58) Field of Classification Search .................. None
See application file for complete search history.

(56) References Cited

U.S. PATENT DOCUMENTS

| | | | |
|---|---|---|---|
| 6,064,095 A * | 5/2000 | Fu | 257/355 |
| 6,713,814 B1 | 3/2004 | Koscielniak | |
| 7,067,365 B1 | 6/2006 | Lee et al. | |
| 2005/0090049 A1 | 4/2005 | Abadeer et al. | |
| 2005/0112822 A1 | 5/2005 | Litwin | |
| 2006/0220120 A1 | 10/2006 | Horch | |
| 2009/0256199 A1 * | 10/2009 | Denison et al. | 257/343 |

FOREIGN PATENT DOCUMENTS

WO 2006136979 A2 12/2006

OTHER PUBLICATIONS

Han, X., and C. Xu. "Design and Characterization of High-voltage NMOS and PMOS Devices in Standard 0.25 μm CMOS Technology." Microelectronics Journal 38.10-11 (2007): 1038-041.*
X. Han et al., "Design and Characterization of STI Compatible High-Voltage NMOS and PMOS Devices in Standard CMOS Process," Proc. ESSDERC 2007, pp. 175-178.

* cited by examiner

*Primary Examiner* — Victor A Mandala
*Assistant Examiner* — Joseph Schoenholtz

(57) ABSTRACT

An electronic device can include a first well region of a first conductivity-type and a second well region of a second conductivity-type and abutting the first well region. The first conductivity-type and the second conductivity type can be opposite conductivity types. In an embodiment, an insulator region can extend into the first well region, wherein the insulator region and the first well region abut and define an interface, and, from a top view, the insulator region can include a first feature extending toward the first interface, and the insulator region can define a first space bounded by the first feature, wherein a dimension from a portion of the first feature closest to the first interface is at least zero. A gate structure can overlie an interface between the first and second well regions.

17 Claims, 6 Drawing Sheets

TRANSISTOR AND METHOD THEREOF

FIELD OF THE DISCLOSURE

The present invention relates to electronic devices, and more particularly, to electronic devices having a transistor.

RELATED ART

Insulated gate field effect transistors (IGFET), which include metal-oxide semiconductor field effect transistors (MOSFETs), are a common type of power transistor. During an on state, a voltage is applied to the gate of a power transistor to form a conduction channel between the source and drain region, thereby allowing current to flow through the power transistor. The resistance of the device during the on state is based upon the specific on-resistance (sRon) of the power transistor. During an off state, any voltage applied to the gate structure is sufficiently low so that no significant current flows through its channel. Since no significant current flows through the power transistor during the off state, a high voltage differential can occur between the source and drain. The voltage at which an IGFET conducts current while maintaining an "off" signal at its gate is referred to as the breakdown voltage (BVdss).

BRIEF DESCRIPTION OF THE DRAWINGS

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device that includes a lateral power transistor is disclosed. The power transistor includes a first well region of a first conductivity type and a second well region of a second conductivity type that abut each other. An insulator region is formed in the second well region that includes features that extend toward the first well, wherein a dimension from a portion of a feature closest to the first well region is at least zero. Such an electronic device will be better understood with reference to FIGS. 1-16 herein.

The term "primary surface" is intended to mean a surface of a substrate from which electronic components are subsequently formed. The primary surface may be an original surface of a substrate before formation of any structures or may be a surface from which trenches or other permanent structures are formed. For example, the electronic components can be formed at least partly within an epitaxial layer overlying a base material.

The term "power transistor" as used herein is intended to mean a transistor capable of maintaining a voltage differential between its drain and its source of at least ten volts while in an off state. The term "20 volt power transistor" would refer to a power transistor capable of maintaining a voltage differential of at least 20 volts between its source and drain while in an off state.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 1:
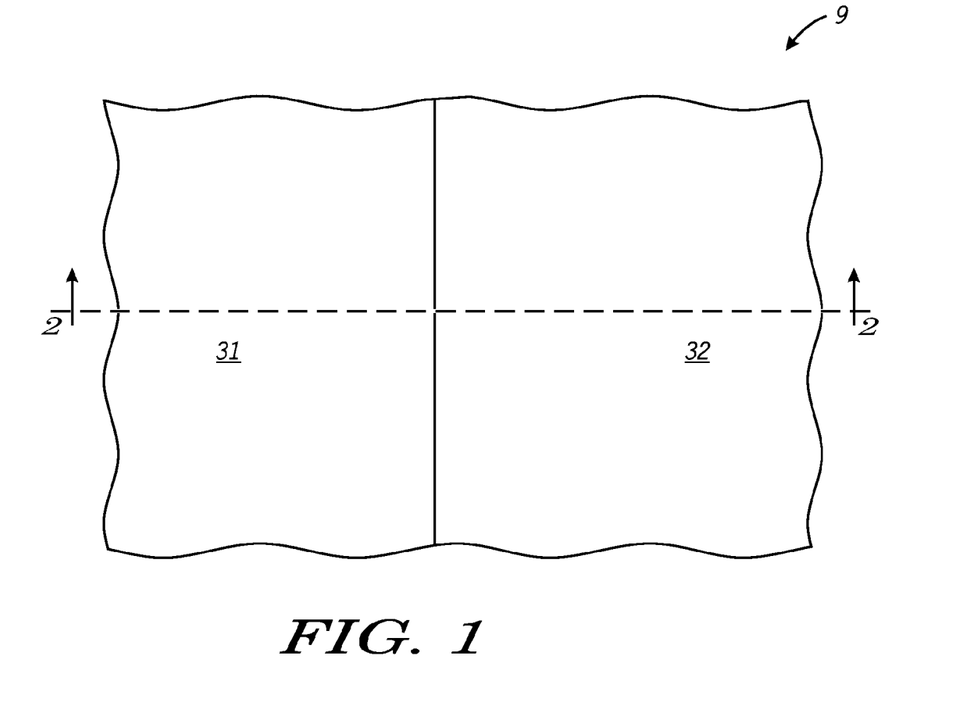
FIGS. 1 and 2 include illustrations of a top view and a cross-sectional view of a portion of a workpiece after formation of well regions.

FIG. 1 includes an illustration of a top view of a portion 9 of a workpiece where an electronic component, such as an integrated circuit, is being formed. In one embodiment, a lateral transistor, such as a power transistor, is to be formed at portion 9 of the workpiece of FIG. 1. The power transistor can be integrated as part of an integrated circuit along with logic circuits or other circuits, or the power transistor can be an individual transistor device that can include additional power transistors integrated together to form a single transistor. The workpiece of FIG. 1 includes a p-type well region 31, and an n-type well region 32, and an interface 25 between well region 31 and well region 32.

Figure 2:
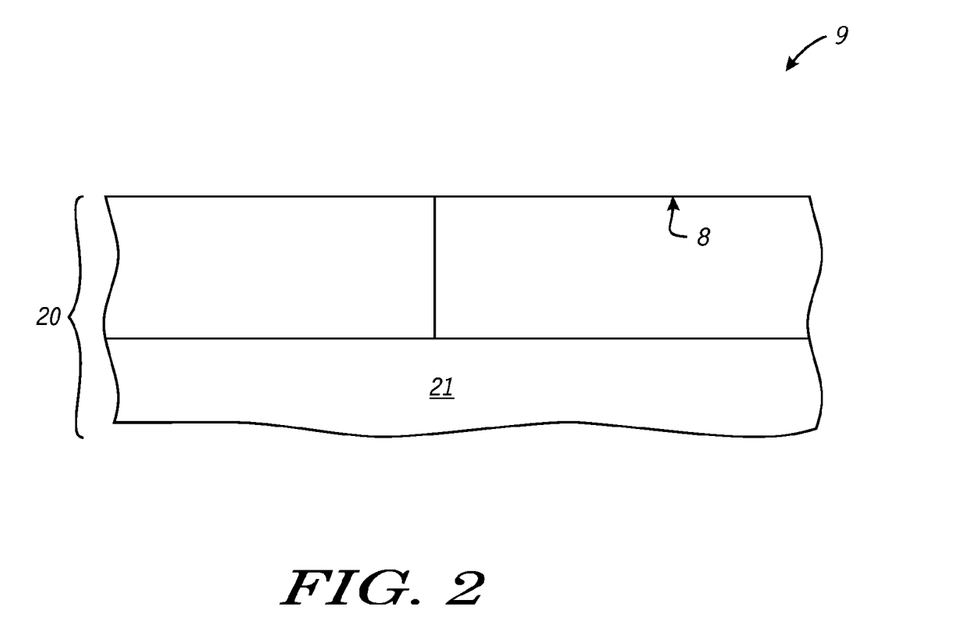

FIG. 2 includes a cross-sectional illustration of the workpiece of FIG. 1 at cross-section line 1-1, and illustrates a substrate 20 that includes a p-type layer 21, p-type well region 31, and an n-type well region 32. The well regions 31 and 32 extend from a primary surface 8 of the workpiece, and overlie and abut layer 21. Well region 31 and well region 32 abut to define interface 25, which lies in a plane that is substantially perpendicular to the primary surface 8. One skilled in the art will appreciated that layer 21 can be an n-type layer in an alternate embodiment.

Substrate 20 includes a semiconductor material such as silicon, though one skilled in the art will understand that other semiconductor materials may be used including silicon-germanium, silicon-germanium-carbon, carbon-doped silicon, or the like. Well regions 31 and 32 can be formed at substrate 20 along with layer 21 by using conventional doping and diffusion techniques. Alternatively, well regions 31 and 32 can be formed over a base substrate that includes layer 21 by using a conventional epitaxial growth technique. In an embodiment suitable for a 20 to 100 volt power transistor, layer 21 has a p-type dopant concentration of about 1E15 atoms/cm3, well region 31 has a p-type dopant concentration of about 1E17 to about 5E17 atoms/cm3, and has a thickness on the order of about 1 to about 5 um, and well region 32 has an n-type dopant concentration of about 1E16 to about 1E17 atoms/cm**3, and has a thickness on the order of about 1 to about 5 um.

Figure 3:
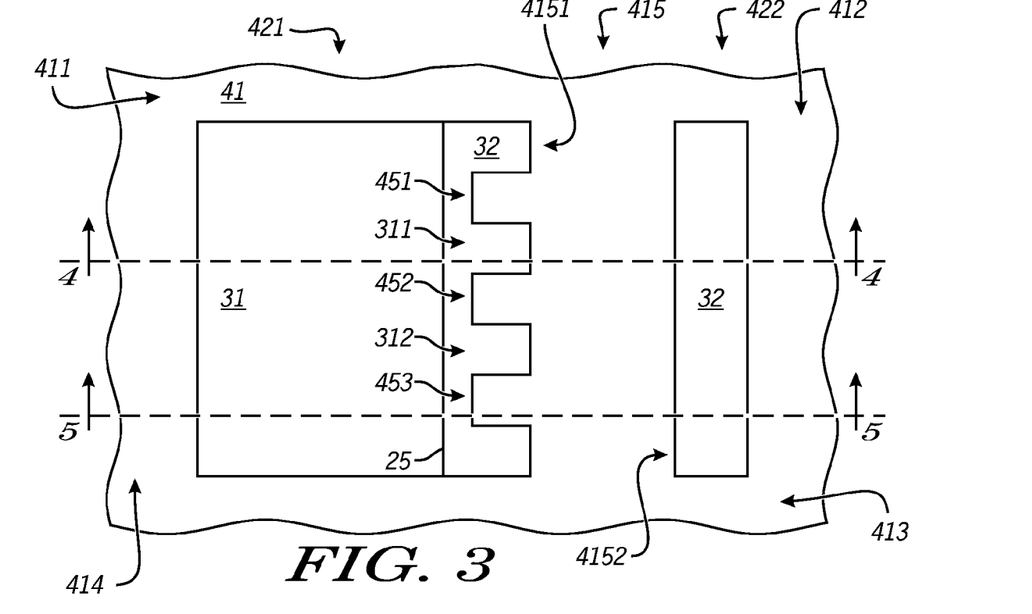
FIGS. 3-5 include illustrations of a top view and cross-sectional views of the workpiece of FIG. 1 after formation of an insulator region.
Figure 4:
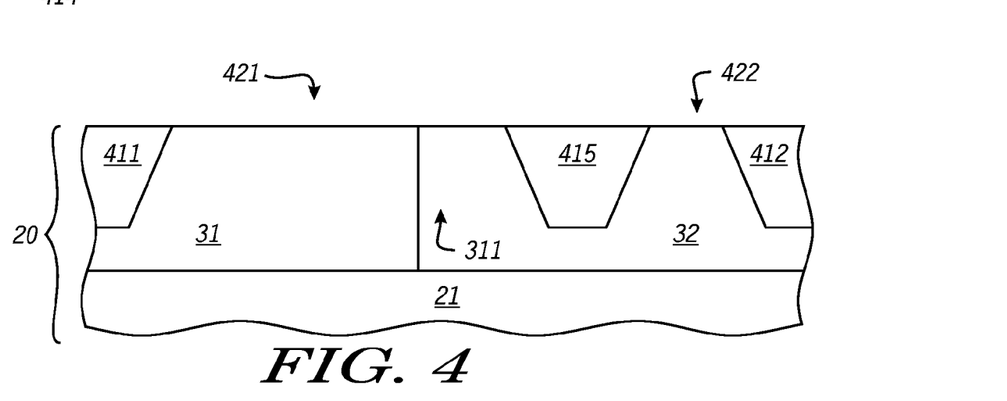
Figure 5:
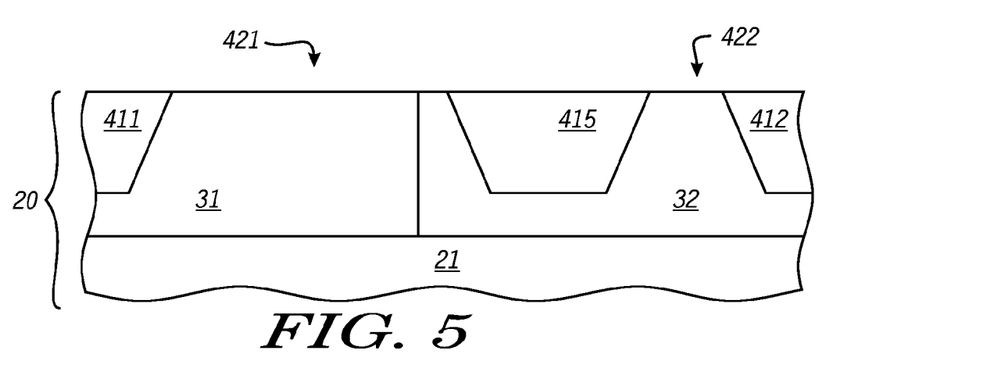

A field isolation region 41 that extends from the primary surface 9 is formed at the workpiece of FIG. 1 and, as illustrated in FIGS. 3-5. The field isolation region 41 defines the location of features of a lateral power transistor being formed. For example, referring to the top view of FIG. 3, a perimeter of the field isolation region 41 is formed by insulator regions 411-414, and an interior portion of the field isolation region 41 that is connected between insulator regions 411 and 413 is formed by insulator region 415. In a completed power transistor, the region under insulator region 415 is a portion of the drift region of the power transistor. The term "drift isolation regions" as used herein is intended to mean an insulator region, such as insulator region 415, under which a drift region between the source and drain of a power transistor is formed. Placement of the insulator region 415 defines a location 422 where a portion of the well region 32 is exposed, and a region 421 where a portion of both well region 31 and well region 32 are exposed, including interface 25. A drain of the power transistor will be formed at location 422, an accumulation region of the power transistor will be formed at a location between insulator region 415 and interface 25, a drift region of the power transistor will be formed between well region 31 and location 22, a portion of which will underlie the insulator region 415 in well region 32, and channel and source regions of the power transistor will be formed within the well region 31.

From a top view, as illustrated at FIG. 3, the insulator region 415 includes an edge 4151 and an edge 4152, where edge 4151 is closer to interface 25 than edge 4152, and includes a plurality of features, including features 451-453, that extend toward the interface 25, and which define a corresponding plurality of spaces, including spaces 311 and 312, of well region 32. For example, space 311 is bounded by feature 451 and feature 452. One skilled in the art will appreciate that the insulator region 415 can include more or fewer features than that illustrated. The plurality of features can repeat in a uniform or non-uniform manner, and can have the same or different shapes. The plurality of features illustrated at FIG. 3 repeat in a uniform manner, and the features have substantially the same orthogonal rectilinear shape. FIG. 4 illustrates a cross-sectional view of the workpiece of FIG. 3 at cross-section line 4-4, which bisects the edge of the insulator region 415 at a location adjacent to space 311 that is furthest from interface 25. FIG. 5 illustrates a cross-sectional view of the workpiece of FIG. 3 at the location indicated by cross-section line 5-5, which bisects the edge of isolation region 412 at a location of feature 452 that is closest to interface 25. Dimensions of the features 451-453 and spaces 311 and 312 are described in more detail later in this specification.

Figure 6:
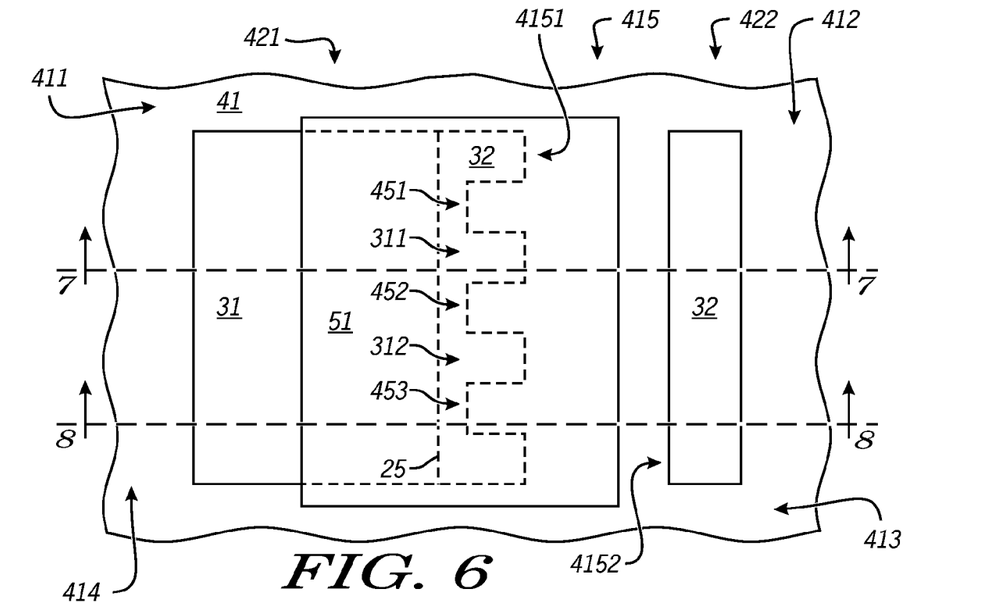
FIGS. 6-8 include illustrations of a top view and cross-sectional views of the workpiece of FIG. 3 after formation of a gate structure.
Figure 7:
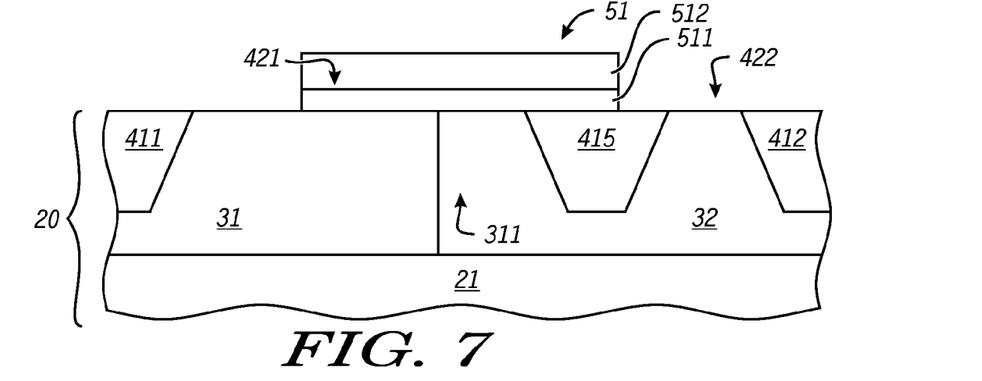
Figure 8:
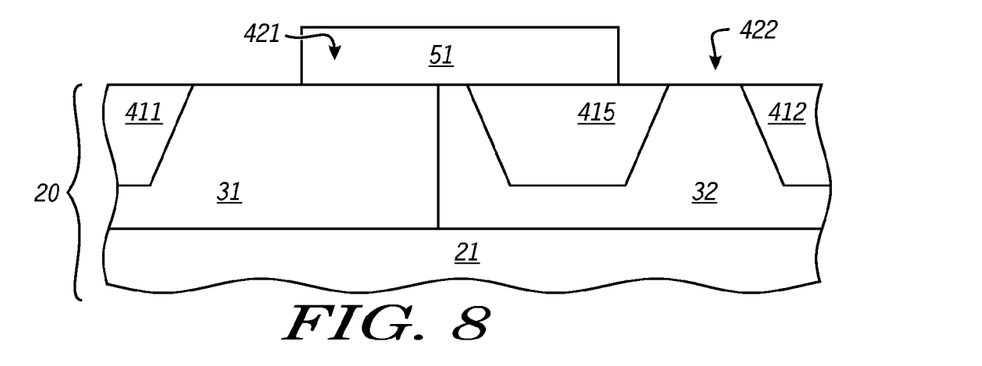

A gate structure 51 of the power transistor is formed overlying the workpiece of FIGS. 3-5 as illustrated at FIG. 6, which is a top view of the workpiece of FIGS. 3-5. FIG. 7 illustrates a cross-sectional view of the workpiece of FIG. 6 at cross-section line 7-7, and illustrates gate structure 51 in greater detail to include a dielectric region 511, and a conductive region 512, which respectively form a gate dielectric and a conductive gate of the power transistor. The gate structure 51 abuts the well region 31, the well region 32, and the insulator 415. As illustrated at FIG. 7, the entire well region 32 that is adjacent to the primary surface 8 and between the insulator region 415 and the well region 31, which corresponds to the accumulation region of the power transistor, is covered by the gate structure 51. Therefore, the interface 25 is contained within the perimeter of the gate structure. FIG. 8 illustrates a cross-sectional view of the workpiece of FIG. 6 at the location of cross-section line 8-8.

Figure 9:
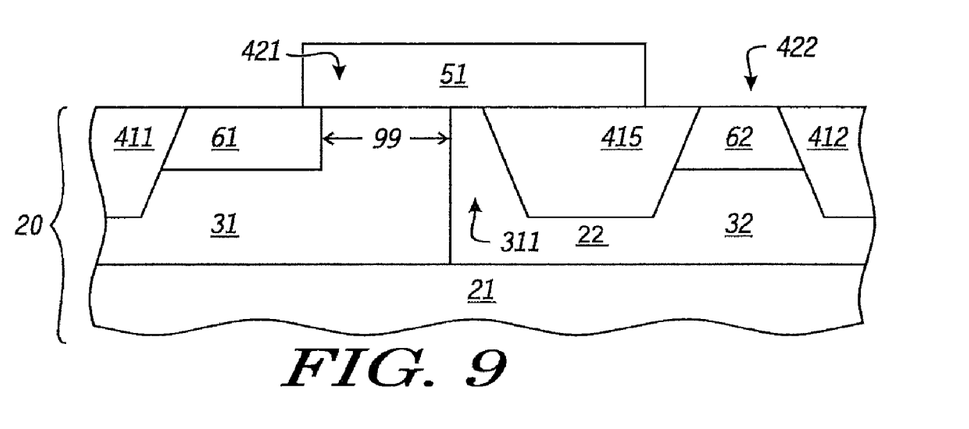
FIG. 9 includes an illustration of a cross-sectional view of the workpiece of FIG. 6 after formation source and drain regions.

A source region 61 and a drain region 62 are formed within the workpiece of FIGS. 6-8 as illustrated at FIG. 9, which is a cross-sectional view at the same location as illustrated FIG. 7. The source region 61 and drain region 62 are n-type doped regions that can have a dopant concentration of about 1E19 atoms/cm**3 or greater. The channel length of the transistor being formed has the dimension 99 as illustrated at FIG. 9, as will be described in further detail herein.

Figure 10:
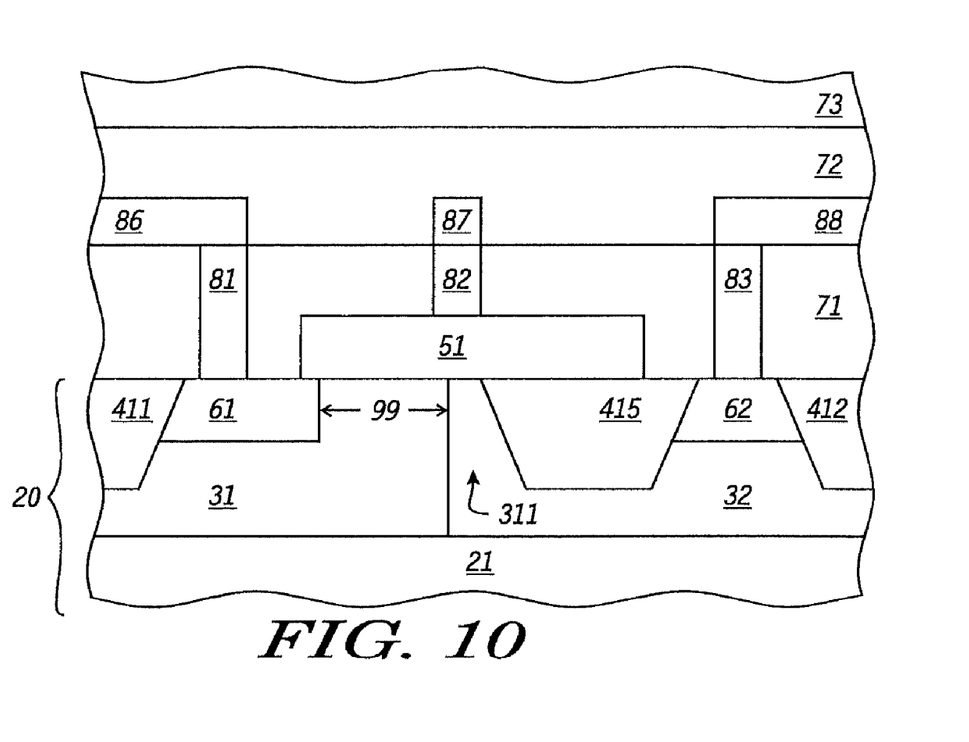
FIG. 10 includes an illustration of a cross-sectional view of the workpiece of FIG. 9 after formation a passivation layer.

FIG. 10 illustrates a substantially complete electronic device that includes an interlevel dielectric layer 71 formed over the workpiece by a conventional technique. Interlevel dielectric layer 71 is patterned to form contact openings that extend to source region 61, to drain region 62, and to gate structure 51. Interlevel dielectric layer 71 can include an insulating material, such as an oxide, a nitride, an oxynitride, or a combination thereof. In a specific embodiment, an anisotropic etch can be used to form the contact openings.

Conductive plugs 81-83 and conductive lines 86-88 are then formed. In one embodiment, conductive plugs 81-83 are formed prior to conductive lines 86-88. In another embodiment, conductive plugs 81-83 are formed concurrently using a conventional dual-inlaid process. Conductive plugs 81-83 and conductive lines 86-88 can include the same or different conducting materials. Each of conductive plugs 81-83 and conductive lines 86-88 can include doped silicon, tungsten, titanium, tantalum, titanium nitride, tantalum nitride, aluminum, copper, another suitable conductive material, or any combination thereof. In one particular embodiment, conductive plugs 81-83 include tungsten and conductive lines 86-88 include mostly copper.

In another embodiment (not illustrated), additional insulating and conductive layers can be formed and patterned to form one or more additional levels of interconnects. After the last interconnect level has been formed, passivation layer 73 is formed over substrate 20. Passivation layer 73 can include one or more insulating film, such as an oxide, a nitride, an oxynitride, or a combination thereof.

One skilled in the art will appreciated that for a given process, the various dimensions of the features 451-453 of the insulator region 451 are selected to provide a desired drain-to-source breakdown voltage (BVdss) and specific on resistance (sRon). A high BVdss, e.g., about 20 volts or greater, and a low sRon, e.g., about 10 mOhm*mm2 or less, are generally desirable for a power transistor but difficult to manufacture across the entire range of a typical misalignment tolerance of about +/−0.1 um for process technologies based on 0.25 um design rules or less. Various dimensions of the features 451-453 for an exemplary process having a misalignment of about +/−0.1 um between the well region 31 and the insulator region 415 are provided below. The exemplary process can be a process based on 0.18 um design rules. For 0.18 um design rules, the smallest feature or space used will be about 0.18 um. The exemplary process includes a gate dielectric having an oxide equivalent thickness (Tox) of about 7 nm, a field isolation thickness of the insulator region 415 of about 0.4 um, and a doping concentration of the well region 31 and the well region 32 of about 1E17 atoms/cm$^{}$3 to about 3E17 atoms/cm$^{**}$3.

Figure 11:
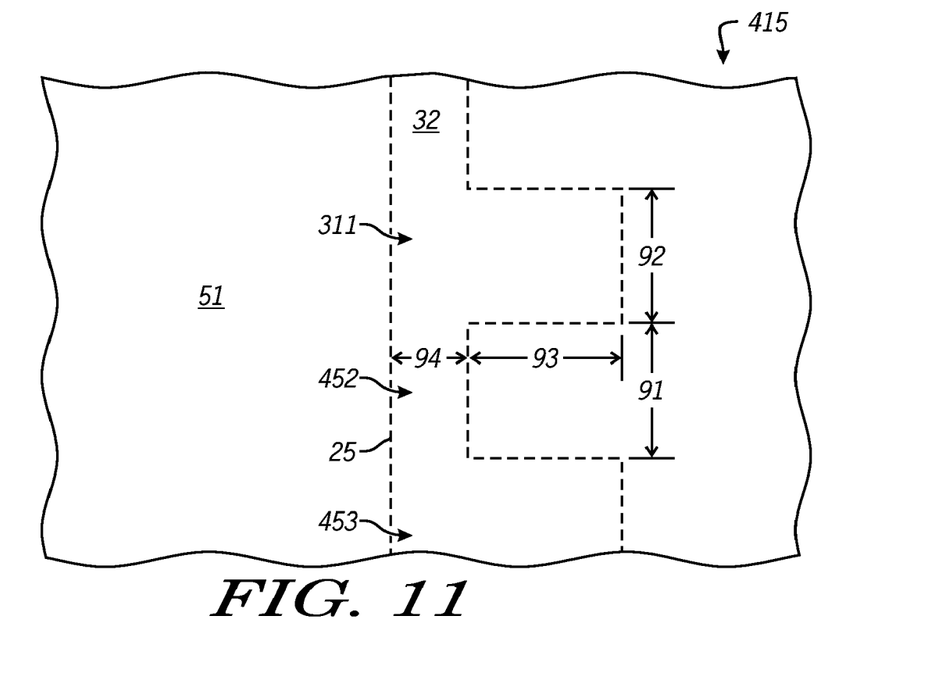
FIG. 11 includes an illustration of a portion of the workpiece of FIG. 3 in greater detail.

FIG. 11 illustrates a top view of a portion of FIG. 3 that illustrates feature 452, space 311, and interface 25 in greater detail. Many specific dimensions are recited with respect to the illustration of FIG. 11 to aid in understanding the concepts as disclosed herein, and are not intended to limit the scope of the present invention. The design dimension of the channel length (Lch) is about 0.4 um (dimension 99 of FIG. 9). The dimension 91 is the width of feature 451, and has a design value that can be selected to be equal to or less than the channel length of the power transistor. For example, dimension 91 can be selected to be in the range of about 0.3 to about 0.4 um, assuming negligible processing tolerance in the manufacture of feature 452 as compared to the misalignment tolerance between the insulator region 415 and the interface 25. The dimension 92 is the width of space 311 and has a design value that is selected such that the ratio of width of space 311 (dimension 92) to the width of feature 451 (dimension 91) (ratio=Width Space/Width Feature) can be in the range of about 0.25 to about 1.7. For example, dimension 92 can have a design value selected to be in the range of about 0.1 um to about 0.5 um.

The dimension 93 is the length of feature 452, and has a design value that is selected such that the ratio of the width of feature 452 (dimension 91) to the length of feature 452 (dimension 93) (ratio=Width Feature/Length Feature) can be in the range of about 0.5 to about 2.0. For example, dimension 93 can have a design value selected to be in the range of about 0.2 um to about 0.6 um, assuming negligible processing tolerance as discussed above.

The dimension 94 is the shortest distance between the insulator region 451 and the interface 25, and has a design value selected based upon the misalignment tolerance between the insulator region 451 and the interface 25 to ensure feature 451 does not extend beyond the line defined by the interface 25 from a top view. Therefore, the dimension 94 can be selected to be about 0.1 um, whereby the dimension 94 in a manufactured power transistor will be between about 0 and about 0.2 um.

Figure 12:
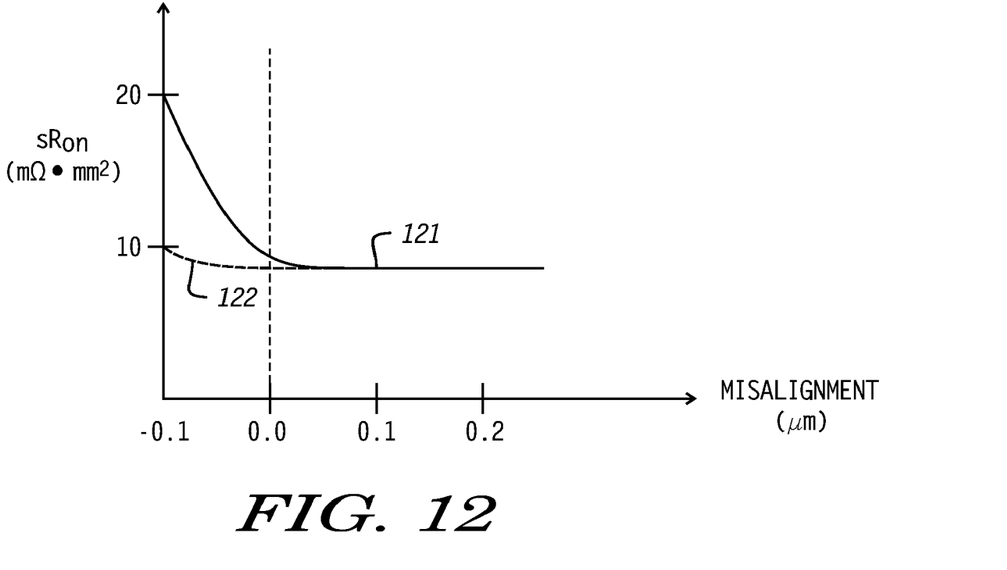
FIGS. 12 and 13 include illustrations of graphs of various operating characteristics of a power MOSFET.

The disclosed power transistor design demonstrates an unexpected result in manufactured power transistors, by demonstrating a characteristic wherein both sRon and BVdss are relatively insensitive to misalignment between the well region 31 and the insulator region 415. Referring to FIG. 12, curve 121 (solid line) represents sRon for a power transistor having a conventional drift isolation region, while curve 122 (dashed line) represents the sRon for the disclosed power transistor having a drift isolation region with features as disclosed, such as features 451-453. As indicated by curve 122, sRon for the disclosed power transistor is relatively constant over the misalignment range, with only a slight increase in sRon for a misalignment of −0.1 as compared to sRon for a misalignment of 0.0. However, sRon for a power transistor having a conventional drift isolation region increases significantly as the misalignment approaches −0.1. For example, sRon for a misalignment of −0.1 is greater than about 1.2 times sRon for a misalignment of 0.0, and the power transistor having a conventional drift isolation region does not demonstrate a constant sRon until a misalignment of greater than 0.0, such as a misalignment of 0.03 um or greater. One skilled in the art will appreciate that the term "conventional drift isolation region" as used herein is intended to mean a drift isolation region that has an edge closest to the channel region of the power transistor that is substantially straight, e.g., does not includes the alternating features and spaces illustrated at edge 4151 of insulator region 415 of the disclosed power transistor of FIG. 4, or that has features or spaces with widths significantly larger than those described herein.

It is believed that the sensitivity of sRon to negative misalignment demonstrated by power transistors having conventional drift isolation regions is due to current crowding at the accumulation region, e.g., between the drift isolation region and the n-well/p-well junction. The effects of this current crowding, however, is believed mitigated with the disclosed power transistor because the spaces, e.g., spaces 311 and 312, between the features 451-453 of insulator region 415 allow for a larger area associated with the accumulation region, and therefore, less current crowding.

Figure 13:
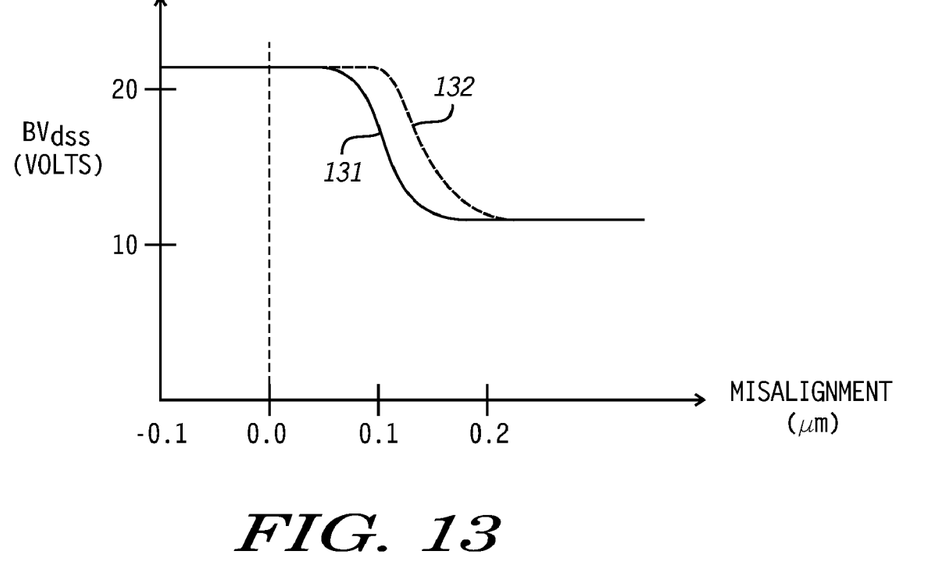

The stability of sRon to misalignment for the disclosed power transistor is further unexpected when combined with the observation that BVdss for the disclosed power transistor also remains stable for the entire range of misalignment tolerances even though the accumulation area increased. Referring to FIG. 13, curve 131 (solid line) represents BVdss for a power transistor having a conventional drift isolation region, while curve 122 (dashed line) represents BVdss for the disclosed power transistor having a drift isolation region with features as disclosed, such as features 451-453. As indicated by curve 132, BVdss for the disclosed power transistor is relatively constant over the entire misalignment range, even at a misalignment of 0.1. While BVdss is more stable than sRon for a power transistor having a conventional drift isolation region, there is still some sensitivity to larger amounts of misalignment as illustrated for a misalignment of 0.1 um, e.g., VBdss is about 1.2 times or greater than VBdss for a misalignment of 0.0 um.

One skilled in the art will appreciate that positive amounts of misalignment, which correspond to an accumulation region having a greater area, would be expected to result in BVdss dropping more quickly for the same amount of accumulation area than that observed. However, the disclosed power transistor demonstrates a greater tolerance for misalignment that results in accumulations regions having a greater area as illustrated by curves of FIGS. 12 and 13. For example, for a misalignment that places the drift region at about 0.0 um from the well region 31, e.g., such as about 0.05 um, a BVdss of about 20 volts or greater and an sRon of about 7 mOhm*mm$^{**}$2 or less can be expected.

Thus, inclusion of the insulator region features, such as features 451-453, in the disclosed power transistor has resulted in a power transistor design having a BVdss characteristic that is more insensitive to the same variation due to a maximum misalignment dimension, e.g., a misalignment of about +0.1 um, as illustrated by curve 132 of FIG. 13. The stable nature of the BVdss of the disclosed power transistor is believed attributable to the three-dimensional layout of the alternating features 451-453 and spaces 311 and 312 causing electric fields in three different orthogonal directions within the accumulation region. During an off-state, the substantially orthogonal relationship of the electric fields causes the fields to interact with each other in a manner that prevents formation of an ionization region within the accumulation region for a given area and voltage, thereby preventing avalanche breakdown. This is different from a conventional power transistor having a substantially two-dimensional STI interface that cause significant electric fields in only two dimensions, thus allowing for an electric field of sufficient length in a lateral dimension to facilitate creation of an ionization region where avalanche breakdown can occur.

Figure 14:
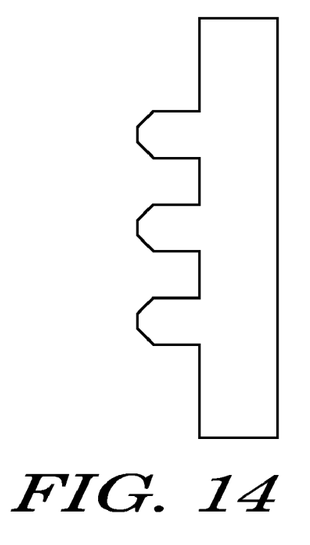
FIGS. 14-16 include illustrations of a top view of alternate feature shapes.
Figure 15:
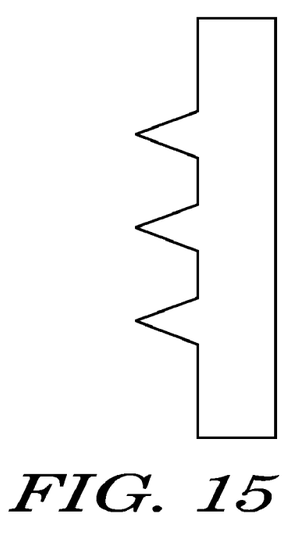
Figure 16:
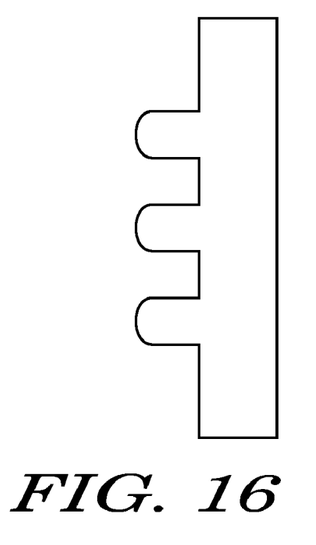

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires. For example, while features of insulator region 415 have been illustrated orthogonal rectilinear features, one skilled in the art will appreciate that the features can be trapezoidal rectilinear as illustrated in FIG. 14, triangular rectilinear as illustrated at FIG. 15, or can include non-linear portions as illustrated at FIG. 16. In addition, while a specific embodiment has been described herein for an n-type power transistor, one skilled in the art will appreciate that the conductivity types described in the figures can be reversed to form a p-type power transistor. The well regions 31 and 32 are illustrated as being formed overlying a p-type substrate layer 31, one skilled in the art will appreciate that the well regions 31 and 32 and subsequent features, can be formed overlying an n-type substrate, or various other features. For example, the well regions 31 and 32 can overlie an insulating layer, or multiple layers having different dopant types.

In a first aspect, an electronic device can include a first well region of a first conductivity-type and second well region of a second conductivity-type abutting the first well region at a first interface. From a top view the first interface generally extends in a first direction, the first conductivity-type and the second conductivity type being opposite conductivity types. The electronic device can also include an insulator region extending into the first well region, wherein the insulator region and the first well region abut and define a second interface. From a top view, the insulator region includes a first feature extending toward the first interface, and the insulator region defines a first space bounded by the first feature, wherein a dimension from a portion of the first feature closest to the first interface is at least zero, and a transistor gate structure overlying the first interface.

In one embodiment of the first aspect, the second interface is contained within a perimeter of the gate structure when viewed from a top view. In another embodiment of the first aspect a portion of the insulator region closest to the first interface is less than about 0.2 um from the first interface. In another embodiment of the first aspect, the electronic device can include a drain region of the transistor having the first conductivity type, and being electrically connected to the first well region, wherein the insulator region is between the drain region and the first interface. In addition to including the drain, the electronic device can include a source region of the transistor having the first conductivity type, the first interface being between the source region and the insulator region.

In another embodiment of the first aspect, a portion of the insulator region closest to the first interface is less than twice a misalignment tolerance from the first interface. In another embodiment of the first aspect, the first feature is an orthogonal rectilinear feature, a trapezoidal rectilinear feature, or a triangular rectilinear feature. In another embodiment of the first aspect, a ratio of the width of the first space to a width of the first feature is greater than about 0.25. In addition, the ratio can be less than about 1.7. In addition to having the ratio of the width of the first space to a width of the first feature is greater than about 0.25, the electronic device can have a ratio of the width of the first feature to a length of a channel of the transistor that is less than about 1. In addition, the device can include a ratio of the width of the first feature to a length of the first feature is greater than about 0.5, and that is less than about 2.0.

In another embodiment, the device further includes the insulator region including a plurality of features, including the first feature and a second feature, that define a plurality of spaces including the first space and a second space, wherein the first space is between the first feature and the second feature, and the second feature is between the first space and the second space. In addition, each feature of the plurality of features is a rectilinear feature.

In a second aspect, a process of forming an electronic device includes providing a substrate comprising a first well region of a first conductivity-type abutting a second well region of a second conductivity-type at a first interface, from a top view the first interface generally extends in a first direction, the first conductivity-type and the second conductivity type being opposite conductivity types. The process can also include forming an insulator region extending into the first well region, wherein the insulator region and the first well region abut and define a second interface region, and, from a top view, the insulator region includes a first feature extending toward the first interface region, and the insulator region defines a first space bounded by the first feature, wherein a dimension from a portion of the first feature closest to the first interface is at least zero. The process can also include a transistor gate structure overlying the first interface.

In one embodiment of the first aspect a portion of the insulator region closest to the first interface is less than about 0.2 um from the first interface. In another embodiment of the first aspect, from a top view, the second interface is contained within a perimeter of the gate structure. In another embodiment the first aspect can include forming a drain region of the transistor having a first conductivity type, and being electrically connected to the first well region, wherein the insulator region is between the drain region and the first interface, and forming a source region of the transistor having the first conductivity type, the first interface being between the source region and the insulator region. In another embodiment of the first aspect, a portion of the insulator region closest to the first interface is less than about twice a misalignment tolerance from the first interface.

In a third aspect, an electronic device includes a first well region of a first conductivity-type. The electronic device can also include a second well region of a second conductivity-type abutting the first well region at a first interface, from a top view the first interface defines a first interface that generally extends in a first direction, the first conductivity-type and the second conductivity type being opposite conductivity types. The electronic device can also include an insulator region extending into the first well region, wherein the insulator region and the first well region abut and define a second interface, wherein the first interface is spaced apart from the second interface by less than about 0.05 um. The electronic device can also include a gate structure of a transistor overlying the first interface, wherein the transistor has a breakdown voltage of greater than about 20 volts and an on resistance of less than about 7 mOhm*mm**2.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. For example, various values disclosed herein as being "about" or "approximately" a specific value also disclose the specific value precisely. For example, a BVdss of greater than about 20 volts would also disclose a BVdss of greater than 20 volts. A dimension of about 0.4 um or less would also disclose a dimension of 0.4 um or less. Thus, to the maximum extent allowed by law, the scope of the present invention is to be determined by the broadest permissible interpretation of the following claims and their equivalents, and shall not be restricted or limited by the foregoing detailed description.

Note that not all of the activities described above in the general description or the examples are required, that a portion of a specific activity may not be required, that one or more further activities may be performed in addition to those described, and that different activities may be performed to form similar features. Still further, the order in which activities are listed are not necessarily the order in which they are performed.

What is claimed is:

1. An electronic device comprising:
   a first well region of a first conductivity-type;
   a second well region of a second conductivity-type abutting the first well region at a first interface, from a top view the first interface generally extends in a first direction, the first conductivity-type and the second conductivity type being opposite conductivity types;
   an insulator region extending into the first well region, wherein the insulator region and the first well region abut and define a second interface, and, from a top view, the insulator region includes a first feature extending toward the first interface, and the insulator region defines a first space bounded by the first feature, wherein a dimension from a portion of the first feature closest to the first interface is at least zero, and wherein a portion of the insulator region closest to the first interface is less than about 0.2 um from the first interface; and
   a transistor gate structure overlying the first interface.

2. The device of claim 1, wherein, from a top view, the second interface is contained within a perimeter of the gate structure.

3. The device of claim 1 further comprising:
   a drain region of the transistor having the first conductivity type, and being electrically connected to the first well region, wherein the insulator region is between the drain region and the first interface.

4. The device of claim 3 further comprising:
   a source region of the transistor having the first conductivity type, the first interface being between the source region and the insulator region.

5. The device of claim 1, wherein a portion of the insulator region closest to the first interface is less than twice a misalignment tolerance from the first interface.

6. The device of claim 1, wherein the first feature is an orthogonal rectilinear feature, a trapezoidal rectilinear feature, or a triangular rectilinear feature.

7. An electronic device comprising:
   a first well region of a first conductivity-types
   a second well region of a second conductivity-type abutting the first well region at a first interface, from a top view the first interface generally extends in a first direction, the first conductivity-type and the second conductivity type being opposite conductivity types;
   an insulator region extending into the first well region, wherein the insulator region and the first well region abut and define a second interface, and, from a top view, the insulator region includes a first feature extending toward the first interface, and the insulator region defines a first space bounded by the first feature, wherein a dimension from a portion of the first feature closest to the first interface is at least zero, and a ratio of the width of the first space to a width of the first feature is greater than approximately 0.25; and
   a transistor gate structure overlying the first interface.

8. The device of claim 7, wherein the ratio is less than approximately 1.7.

9. The device of claim 7, wherein a ratio of the width of the first feature to a length of a channel of the transistor is less than approximately 1.

10. The device of claim 7, wherein a ratio of the width of the first feature to a length of the first feature is greater than approximately 0.5.

11. The device of claim 10, wherein the ratio of the width of the first feature to the length of the first feature is less than approximately 2.0.

12. The device of claim 1, wherein the insulator region includes a plurality of features, including the first feature and a second feature, that define a plurality of spaces including the first space and a second space, wherein the first space is between the first feature and the second feature, and the second feature is between the first space and the second space.

13. The device of claim 12, wherein each feature of the plurality of features is a rectilinear feature.

14. A process of forming an electronic device comprising:
   providing a substrate comprising a first well region of a first conductivity-type abutting a second well region of a second conductivity-type at a first interface, from a top view the first interface generally extends in a first direction, the first conductivity-type and the second conductivity type being opposite conductivity types;
   forming an insulator region extending into the first well region, wherein the insulator region and the first well region abut and define a second interface region, and, from a top view, the insulator region includes a first feature extending toward the first interface region, and the insulator region defines a first space bounded by the first feature, wherein a dimension from a portion of the first feature closest to the first interface is at least zero, and wherein a portion of the insulator region closest to the first interface is less than about 0.2 um from the first interface; and
   forming a transistor gate structure overlying the first interface.

15. The process of claim 14, wherein, from a top view, the second interface is contained within a perimeter of the gate structure.

16. The process of claim 14 further comprising:
forming a drain region of the transistor having a first conductivity type, and being electrically connected to the first well region, wherein the insulator region is between the drain region and the first interface; and
forming a source region of the transistor having the first conductivity type, the first interface being between the source region and the insulator region.

17. The process of claim 14, wherein portion of the insulator region closest to the first interface is less than approximately twice a misalignment tolerance from the first interface.

* * * * *